US012724069B2

(12) United States Patent
Hissen et al.

(10) Patent No.: US 12,724,069 B2
(45) Date of Patent: Sep. 1, 2026

(54) SENSOR CIRCUIT AND METHOD

(71) Applicant: Bonsai Systems Inc., Vancouver (CA)

(72) Inventors: Jurgen Hissen, Port Moody (CA); Bernard Joseph Andre Guay, Vancouver (CA); Matthew William Mcadam, Vancouver (CA); Ajith Sivadhasan Ramani, Oakville (CA); Mark Allen Hiebert, Coquitlam (CA)

(73) Assignee: Bonsai Systems Inc., Vancouver (CA)

( * ) Notice: Subject to any disclaimer, the term of this patent is extended or adjusted under 35 U.S.C. 154(b) by 161 days.

(21) Appl. No.: 18/758,617

(22) Filed: Jun. 28, 2024

(65) Prior Publication Data

US 2026/0002990 A1 Jan. 1, 2026

(51) Int. Cl.
*G06F 1/00* (2006.01)
*G01R 31/317* (2006.01)

(52) U.S. Cl.
CPC .............................. *G01R 31/31726* (2013.01)

(58) Field of Classification Search
CPC ................................................ G01R 31/31726
See application file for complete search history.

(56) References Cited

U.S. PATENT DOCUMENTS

| | | | | |
|---|---|---|---|---|
| 8,731,105 | B2 | 5/2014 | Bai | |
| 9,264,059 | B2 * | 2/2016 | Tousi | H03M 1/183 |
| 10,177,897 | B2 | 1/2019 | Schell et al. | |
| 10,453,504 | B2 * | 10/2019 | Kang | H04L 7/08 |
| 10,833,772 | B1 * | 11/2020 | Chen | G02F 7/00 |
| 11,171,674 | B2 | 11/2021 | Balakrishnan et al. | |
| 11,750,235 | B2 | 9/2023 | Quinlan et al. | |
| 2012/0147943 | A1 * | 6/2012 | Goodman | H04L 27/01 375/232 |
| 2017/0063383 | A1 | 3/2017 | Yang et al. | |
| 2021/0013897 | A1 * | 1/2021 | Kim | G01R 23/145 |
| 2022/0296169 | A1 * | 9/2022 | Alghorani | G16H 50/20 |
| 2023/0027893 | A1 * | 1/2023 | Wulff | H04B 17/102 |
| 2024/0079774 | A1 | 3/2024 | Kahrizi et al. | |
| 2024/0295593 | A1 * | 9/2024 | Akiyama | H03M 1/121 |
| 2025/0317160 | A1 * | 10/2025 | Chen | H04B 1/0475 |
| 2026/0018226 | A1 * | 1/2026 | Lee | G11C 29/023 |

FOREIGN PATENT DOCUMENTS

| | | | |
|---|---|---|---|
| WO | 2020198335 | A1 | 10/2020 |

* cited by examiner

*Primary Examiner* — Xuxing Chen
(74) *Attorney, Agent, or Firm* — Borden Ladner Gervais LLP

(57) ABSTRACT

A sensor circuit, method and apparatus are provided. A clock source may be configured to generate a clock signal. A plurality of samplers may be configured to receive a plurality of radio frequency signals and to produce, based on the clock signal, a plurality of low-frequency samples. A data analyzer may be configured to process low-resolution representations of the plurality of low-frequency samples collected over a plurality of sampling instances and process them at low or medium resolution to generate one or more data analysis metrics associated with the plurality of RF signals. The sensor circuit including samplers taking low-frequency samples, and a data analyzer processing low-resolution or medium-resolution representations of a number of samples collected over time for statistical analysis, provides power efficiency compared to known approaches that use power-hungry samplers at a high frequency.

30 Claims, 4 Drawing Sheets

SENSOR CIRCUIT AND METHOD

FIELD

The present disclosure relates to electronic devices, including but not limited to a sensor circuit and associated systems, computing platforms, methods, and storage media.

BACKGROUND

Analog circuits are used in a number of different applications. Radio frequency (RF) circuits are a subset of analog circuits that operate at radio frequencies. One example of an RF circuit is a power amplifier (PA). There are instances where it can be beneficial to sense one or more parameters relating to an RF circuit.

According to a known approach, a digital predistortion (DPD) filter linearizes a power amplifier. A sensor is provided at the output, and the sensed signal is fed back through to a chip earlier in the chain. The output of the PA goes back through an analog to digital converter (ADC), then undergoes digital processing, then that signal is used to drive a digital predistortion circuit meant to invert the function of the PA to cancel the distortion. Such a method is sampling at or above the Nyquist rate, which is very power hungry.

Improvements in approaches relating to sensor circuits are desirable.

BRIEF DESCRIPTION OF THE DRAWINGS

Embodiments of the present disclosure will now be described, by way of example only, with reference to the attached Figures.

DETAILED DESCRIPTION

Figure 1:
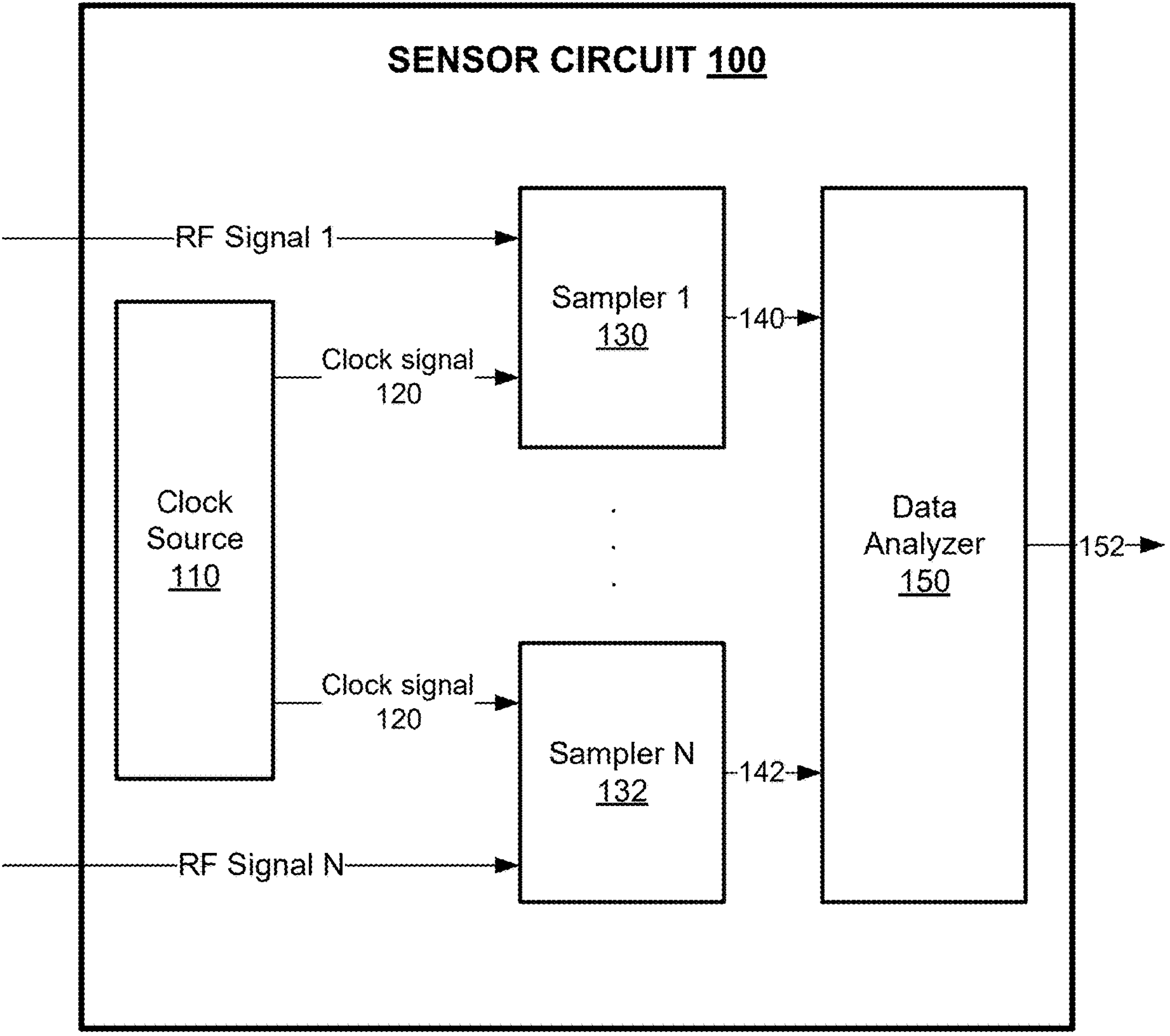
FIG. 1 is a block diagram illustrating a sensor circuit, in accordance with one or more embodiments.

A sensor circuit, method and apparatus are provided. A clock source may be configured to generate a clock signal. A plurality of samplers may be configured to receive a plurality of radio frequency signals and to produce, based on the clock signal, a plurality of low-frequency samples. A data analyzer may be configured to process low-resolution representations of the plurality of low-frequency samples collected over a plurality of sampling instances and to generate one or more data analysis metrics associated with the plurality of RF signals. A signal aligner may be configured to align the plurality of RF signals for sampling, at each of the plurality of samplers, at the same position on a waveform of the RF signals. A sensor circuit including samplers taking low-frequency samples, and a data analyzer processing low-resolution or medium-resolution representations of a number of samples over time for statistical analysis, provides power efficiency compared to known approaches that use power-hungry samplers at a high frequency.

As described above, a known approach using a digital predistortion filter uses feedback outside of the chip, and runs at a high sampling rate, typically at or above the Nyquist rate, which is very power hungry. The Nyquist theorem defines the Nyquist rate as twice the highest frequency of a function or signal to be measured accurately. In an example implementation, the output can be 1 GHz bandwidth, and a digital predistortion filter may require an ADC to sample at 3-5 GHz, which would be extremely power hungry. The ADC in this known approach may comprise a 6-bit or 8-bit ADC, which consumes a lot of power, and each sample may be useful in itself.

In an embodiment, the present disclosure provides a sensor system comprising: a sensor circuit as both generally and specifically described and illustrated herein; and an RF circuit configured to produce one or more of the plurality of RF signals.

In an embodiment, the present disclosure provides a processor-implemented method for processing radio frequency signals, the method comprising: generating a clock signal; receiving a plurality of RF signals; producing, based on the clock signal and on the plurality of RF signals, a plurality of low-frequency samples; processing low-resolution representations of the plurality of low-frequency-samples collected over a plurality of sampling instances; and generating a data analysis metric associated with the plurality of RF signals.

In an embodiment, the present disclosure provides an apparatus comprising: a non-transient computer-readable storage medium having executable instructions embodied thereon; and one or more hardware processors configured to execute the instructions to: generate a clock signal; receive a plurality of RF signals; produce, based on the clock signal and on the plurality of RF signals, a plurality of low-frequency samples; processing low-resolution representations of the plurality of low-frequency samples collected over a plurality of sampling instances; and generate a data analysis metric associated with the plurality of RF signals.

In an embodiment, the present disclosure provides a sensor circuit, comprising: a clock source configured to generate a clock signal; a sampler configured to receive a radio frequency signal and to produce, based on the clock signal, a low-frequency sample; and a data analyzer configured to process low-resolution representations of the low-frequency samples collected over a plurality of sampling instances and to generate a data analysis metric associated with the RF signal.

For the purpose of promoting an understanding of the principles of the disclosure, reference will now be made to the features illustrated in the drawings and specific language will be used to describe the same. It will nevertheless be understood that no limitation of the scope of the disclosure is thereby intended. Any alterations and further modifications, and any further applications of the principles of the disclosure as described herein are contemplated as would normally occur to one skilled in the art to which the disclosure relates. It will be apparent to those skilled in the relevant art that some features that are not relevant to the present disclosure may not be shown in the drawings for the sake of clarity.

Certain terms used in this application and their meaning as used in this context are set forth in the description below. To the extent a term used herein is not defined, it should be given the broadest definition persons in the pertinent art have given that term as reflected in at least one printed publication or issued patent. Further, the present processes are not limited by the usage of the terms shown below, as all equivalents, synonyms, new developments and terms or processes that serve the same or a similar purpose are considered to be within the scope of the present disclosure.

The present disclosure relates to statistical sensors for in-situ observation of an RF circuit, such as a power amplifier. Other examples of an RF circuit include an optical driver, an optical receiver, a low-noise amplifier, an analog to digital converter (ADC), and a digital to analog converter (DAC). A sensor circuit as described herein may comprise one or more samplers, and may include delay adjustment or other circuitry.

A sensor circuit in accordance with one or more embodiments may be provided as an add-on to the RF circuit being observed. The sensor circuit in accordance with one or more embodiments and the RF circuit being observed may be provided as components of a sensor system in accordance with one or more embodiments.

According to one or more embodiments of the present disclosure, the sensor circuit is contained entirely in the same chip as the RF circuit being observed, and may employ sub-Nyquist sampling. According to one or more embodiments of the present disclosure, the sensor circuit is co-integrated into the same chip package as the RF circuit being observed. According to one or more embodiments of the present disclosure, the sensor circuit is provided on same printed circuit board as the RF circuit being observed Sensors or samplers may comprise very low power sample-and-holds, and a clock source may be provided to drive the samplers. The clock rate of the clock source may be independent of the RF signal.

An example implementation may run the clock rate at 1 GHz, even though the RF signal is at 28 GHz. This results in low power, samples, and the sensor circuit collects many of those samples. The system may accumulate or assemble the samples into data that can be analyzed, for example by a controller that is used to make diagnostic observations, and close the loop for live operation. The controller may be provided anywhere in relation to the sensor circuit and may, in an example embodiment, be on the same chip as the sensor circuit.

FIG. 1 is a block diagram illustrating a sensor circuit 100, in accordance with one or more embodiments. The sensor circuit 100 may comprise a clock source 110 configured to generate a clock signal 120. A clock rate associated with the clock signal 120 may be used to establish a sampling rate of the sensor circuit 100. The clock signal may have a clock rate that is asynchronous to a received RF signal, or independent of the RF signal. An advantage of the clock rate being asynchronous to the RF signal is that it is not necessary to know or determine the frequency of the RF signal. Another advantage of the clock rate being asynchronous to the RF signal is that a wider range of clock rates may be used to provide sampling, since there is no requirement for the sampling rate to be synchronous with the RF signal.

For example, for an RF signal having a frequency of 28 GHz, a clock signal having a clock rate of 1.1 GHz or 1.2 GHz may be used. While this may result in sampling the RF signal at different positions or points on the waveform from one sample to another, when the sampling is performed over a plurality of sampling instances, a sufficient number of samples may be collected to obtain relevant and accurate data. In another embodiment, the clock signal has a clock rate that is synchronous to the RF signal. The clock rate of the clock signal may be synchronous to the received RF signal, for example by detecting the RF signal frequency and producing a clock that is a multiple of that frequency. In an example embodiment, the clock source generates the clock signal with a clock rate of 1 GHz and the received RF signal has a frequency of 28 GHz.

A plurality of samplers 130 . . . 132 may be configured to receive a plurality of radio frequency signals, for example RF signal 1 through to RF signal N, as shown in FIG. 1, and to receive the clock signal generated by the clock source 110. In the embodiment of FIG. 1, the same clock signal 120 is provided to plurality of samplers 130 . . . 132. The plurality of samplers 130 . . . 132 may be configured to produce, based on the clock signal 120, a plurality of low-frequency samples 140 . . . 142. The samplers may be low power and low frequency, which is dictated by the clock source. One or more of the samplers may obtain the clock, make its sample, and feed the sampler output to a data analyzer. Other samplers in the system may be configured to do the same thing, and keep gathering these samples up over and over.

In an example implementation, first sampler 130 may be configured to produce a first sample 140 based on the received RF signal 1 and the clock rate of the clock signal 120. Second sampler 132 may be configured to produce a second sample 142 based on the received RF signal N and the clock rate of the clock signal 120. One or more of the plurality of low-resolution samplers 130 . . . 132 may comprise a low-power sample-and-hold sampler, providing both low-frequency and low-power functionality.

The plurality of samplers 130 . . . 132 may be configured to produce the low-frequency samples at a sub-Nyquist sampling rate. Sampling at a low-frequency such as a sub-Nyquist sampling rate contributes to embodiments of the present disclosure providing power savings and advantages compared to known approaches that are power hungry when sampling at a higher frequency, such as at or above the Nyquist rate. The plurality of samplers 130 . . . 132 may be configured to produce the low-frequency-samples at a sampling rate that is asynchronous to the RF signal, or that is synchronous to the RF signal.

A data analyzer 150 may be configured to process low-resolution representations of the plurality of low-frequency samples 140 . . . 142 collected or accumulated over a plurality of sampling instances and to generate a data analysis metric 152 associated with the plurality of RF signals. Known approaches typically use the full resolution output of a sampler. For example, for a 12-bit sampler, the 12-bit sample would be collected and processed. According to one or more embodiments, the data analyzer 150 may be configured to process low-resolution representations of the plurality of low-frequency samples, for example based on the original received resolution of the received low-frequency samples. The data analyzer 150 may be configured to produce or generate the low-resolution representations of the plurality of low-frequency samples collected or accumulated over the plurality of sampling instances.

In an example embodiment, a low-resolution representation may comprise a 1-bit representation. In an example embodiment, a low-resolution representation may comprise a multi-bit representation, where multi-bit comprises anywhere from a 2-bit representation to an 8-bit representation. An 8-bit representation may be considered a medium-resolution representation, which may be processed or provided according to an example embodiment. A known DPD system uses a high-resolution sampler with a resolution of about 12-14 bits, which is very power intensive. Embodiments of the present disclosure provide power efficiency and power savings compared to known approaches by processing low-resolution representations of the plurality of low-frequency samples, or by processing medium-resolution representations of the plurality of low-frequency samples.

When using a sampler to produce a low-frequency sample, collecting a small number of samples such as 1-10 samples would not provide an accurate measurement. The plurality of sampling instances may comprise thousands of samples, hundreds of thousands of samples, or a million samples. The data analyzer 150 is configured to process low-resolution representations of such a plurality of low-frequency samples, which may be collected over a plurality of sampling instances. The data analyzer 150 may be configured to generate one or more data analysis metrics 152 and may be configured to generate a plurality of data analysis metrics.

In an example embodiment, the data analyzer 150 is configured to process low-resolution representations of the plurality of low-frequency samples 140 . . . 142 collected or accumulated over a plurality of sampling instances and to generate a data analysis metric 152 associated with the plurality of RF signals.

In an example embodiment, the data analyzer 150 is configured to generate the data analysis metric 152 based on a low-resolution representation of a comparison of the plurality of low-frequency samples. For example, when the low-resolution representation comprises a 1-bit representation, the data analyzer 150 may be configured to compare a first 1-bit representation of a sample with a second 1-bit representation of a sample. The data analyzer 150 may be configured to collect comparisons of samples. In an example implementation, the data analyzer 150 comprises a comparator or a 1-bit ADC is configured to generate a 1-bit representation of a sample, and to determine whether a sample from a first sampler is greater than a sample from a second sampler. These implementations are extremely different from known DPD approaches which operate using the full-resolution of the samples.

In an example embodiment, the data analyzer 150 may perform data analysis using low-resolution quantized samples, medium-resolution quantized samples, or a comparison of samples. Sampling takes an analog snapshot in time of a continuous time-series like waveform. Samples may be quantized to represent the analog snapshot with a finite number of representations in the voltage domain, such as N bits between 0 volts and 1 volt. For example, an 8-bit quantization comprises 256 possible representations, while a 1-bit quantization results in only 2 possible representations.

In an example embodiment, the data analyzer 150 is configured to perform statistical data assembly with respect to the processed low-resolution representations of the collected plurality of low-frequency samples. In an example embodiment, the data analyzer 150 may build up a histogram based on the processed low-resolution representations of the collected plurality of low-frequency samples, for example using 1-bit or multi-bit representations. For example, a sampler may be provided that has a threshold of zero, so that a sample with a value of 1 is produced for a positive value and a sample with a value of 0 is produced for a negative value. The sampling point may move around on the waveform of the signal, for example when the sampling rate is asynchronous with respect to the RF signal frequency, such as a sampling rate of 1.2 GHz and an RF frequency of 27 GHz. If only 3 samples are collected with values of 1, 1, 1, a related histogram would include a count of 3 positives and zero negatives, which would be statistically inaccurate. However, when the data analyzer 150 collects a large number of samples, such as up to a million samples, it will be statistically accurate.

In an example embodiment, the data analyzer 150 may be configured to generate the data analysis metric 152 associated with the plurality of RF signals, where the data analysis metric comprises a metric of gain. The metric of gain requires two signals. Other metrics may just use one signal, or one of the collected signals. Another example metric is DC offset. Statistical data assembly by the data analyzer 150 may employ many, many processed low-resolution representations of the samples to be able to build a metric. Embodiments of the present disclosure essentially sacrifice sample resolution when processing the samples, compared to known approaches such as DPD, and gather a large amount of the data, and obtain good results from gathering this large amount of data. In an example implementation, the data analyzer 150 uses tens of thousands, or closer to a million, samples to provide accurate results.

In an example embodiment, the data analyzer 150 is configured to provide the generated data analysis metric 152 as information input to a controller (not shown in FIG. 1) to optimize performance of a device-under-observation producing the RF waveform. In such an implementation, the controller may control parameters associated with the device-under-observation. In an example embodiment, the data analyzer 150 is configured to perform data correlation to determine amplitude and phase relationships. In an example embodiment, the generated data analysis metric 152 comprises: relative gain; relative phase; relative distortion; voltage standing wave ratio (VSWR); voltage distribution; current distribution; or reliability protection, or any other parameters or characteristics that may be relevant.

When compared to a known DPD approach, embodiments of the present disclosure collect a similar number of samples. The DPD approach collects samples at a higher clock rate than embodiments of the present disclosure, and each DPD sample is processed at a higher resolution, for example the original resolution of the sample, than the low-resolution representations of the samples of embodiments of the present disclosure. A DPD approach compensates digitally by expanding the signal, to invert the compression that is happening, and high resolution information is collected to be able to do this. Embodiments of the present disclosure may use the data analysis metric 152 as information input to a controller, for example associated with a power amplifier being observed, to adjust gains, phases and/or bias voltages within the amplifier.

The data analyzer 150 may be configured to assemble statistical data, or to assemble data in a statistical manner, for example based on a large number data set, or a data set with a large number of samples. The samples may be collected and assembled into a structure, for example a histogram of positive/negative bins. The data analyzer 150 may assemble the processed low-resolution representations of the samples into a data set with a count of, for example, two or more "bins", where putting the processed low-resolution representations of the samples into bins is part of the assembly process. The data analyzer 150 may perform post-processing, for example based on one or more mathematical operations, to make the samples into a usable data structure. The data analyzer 150 may comprise one or more of hardware, firmware and software. A controller, for example built with neural network, may be configured to take the statistical data, for example one or more data analysis metrics 152, and use the metric(s) as input(s) to determine how to control a device-under-observation.

Consider an example where the data analyzer 150 is configured to generate a data analysis metric 152 relating to gain. The data analyzer 150 may generate a statistical structure of values that relate to gain, based on processed low-resolution representations of the plurality of low-frequency samples collected or accumulated over a plurality of sampling instances. Such operations may form a signature that the data set comprises 100 elements, and the data analyzer may be configured to generate a histogram with 100 bins, one for each element. A controller may be configured to, for example based on training and on the received data analysis metric 152, determine that the gain is too low, and to generate information or a control signal to bump up the bias voltage to get more gain. In an embodiment, statistical data such as the data analysis metric 152 may be employed by a feedback controller to adjust the system to optimize performance.

In many instances, a plurality of samplers may be used, as shown in FIG. 1, for example when it is desirable to concurrently obtain a plurality of samples, for example from an input and output (e.g. Vin and Vout) of a device-under-observation. In other instances, it may be desirable to capture absolute signal statistics on one measurement, for example amplitude on input of an RF amplifier. In an example embodiment, a sensor circuit may just have one sampler, and just one bit can move a threshold with respect to the amplitude, such as the amount of amplitude. The sensor circuit may then assemble an output from one sampler. This may be referred to as an absolute measurement.

According an example embodiment, a single sampler may be provided in the sensor circuit. In such an embodiment, the present disclosure provides a sensor circuit, comprising: a clock source configured to generate a clock signal; a sampler configured to receive a radio frequency signal and to produce, based on the clock signal, a low-frequency sample; and a data analyzer configured to process low-resolution representations of the low-frequency samples collected over a plurality of sampling instances and to generate a data analysis metric associated with the RF signal. In this embodiment, low-resolution representations of the samples produced by the sampler are collected, and the data analysis metric is generated based on the plurality of sampling instances of the processed low-resolution representations of the low-frequency sample produced by the sampler.

Figure 2:
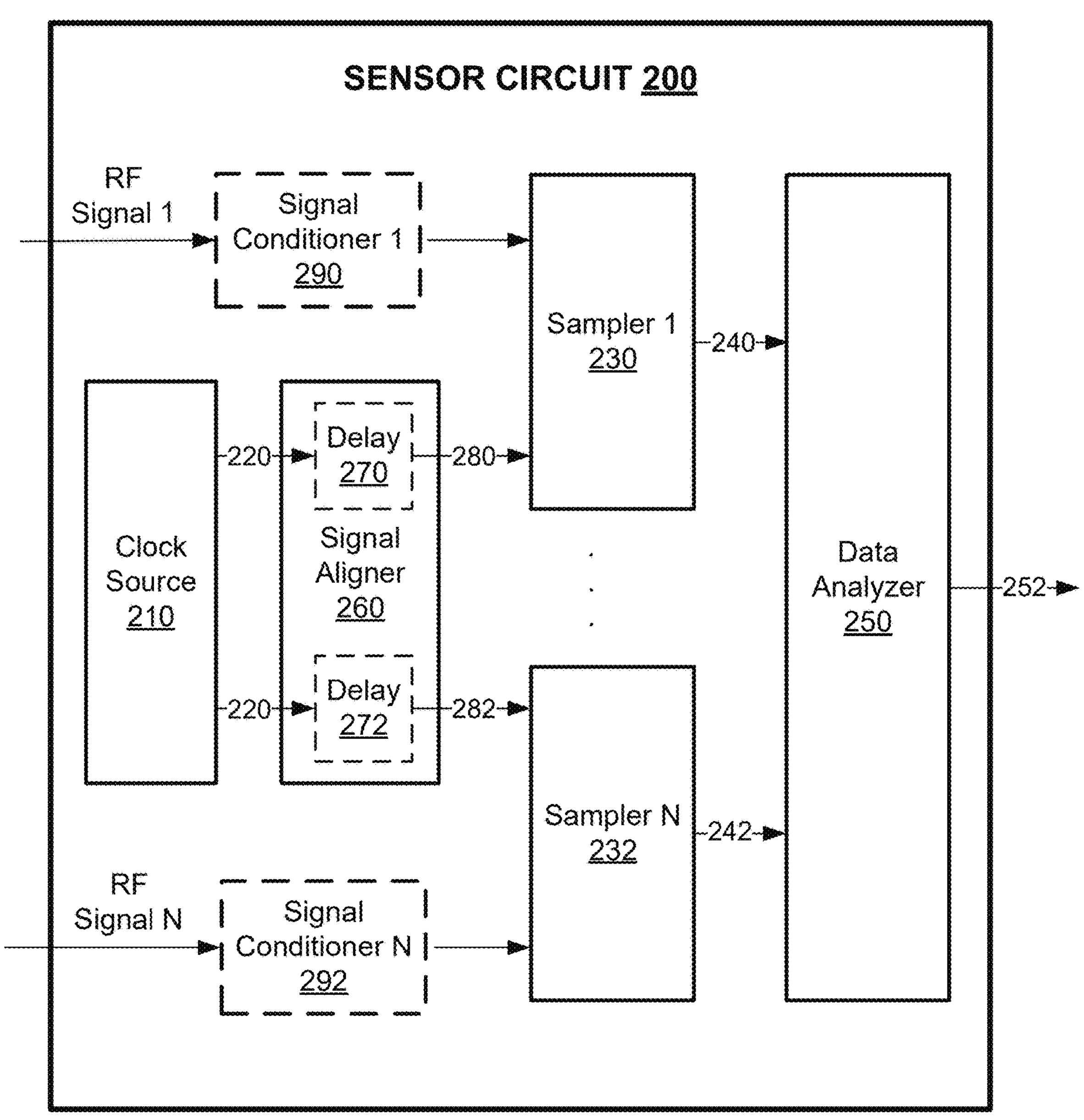
FIG. 2 is a block diagram illustrating a sensor circuit comprising a signal aligner, in accordance with one or more embodiments.

FIG. 2 is a block diagram illustrating a sensor circuit 200 comprising a signal aligner, in accordance with one or more embodiments. As many elements in FIG. 2 are similar to corresponding elements in FIG. 1, detailed discussion of those elements will be omitted and reference is made to related description with respect to FIG. 1. The sensor circuit 200 may comprise a clock source 210 configured to generate a clock signal 220, which may be provided as a plurality of clock signals 220. The clock signals may have a clock rate that is asynchronous to a received RF signal, resulting in greater flexibility, or synchronous with the RF signal.

A plurality of samplers 230 . . . 232 may be configured to receive a plurality of radio frequency signals, for example RF signal 1 through to RF signal N, as shown in FIG. 2, and to receive a plurality of clock signals 220.

The circuit 200 may further comprise a signal aligner 260 configured to align a plurality of received clock signals for sampling, at each of the plurality of samplers 230 . . . 232, at the same relative waveform position on each of the plurality of RF signals. This may be described as sampling at each of the plurality of samplers at a consistent relative waveform position on each of the plurality of RF signals. For example, the signal aligner may align the plurality of clock signals such that the RF signals are sampled at the same position on the RF signal waveform by each of the plurality of samplers 230 . . . 232, such as to provide a relative measurement involving two elements. For example, in relation to a PA that has an input and output, the sensor circuit may be configured to measure the gain between the input ant output. The signal aligner may align the clocks to compensate for delays in the system, take the output from the two samplers (input 1st RF signal and output at 2nd RF signal) and combine them in a different way and measure gain, or another parameter, as a relative measurement.

In an example of relative measurement of Vi and Vo, when passing through a sinusoid into PA, an RF signal may come in at a 1 V peak and come out at a 5 V peak, but it is an oscillating waveform. The signal aligner 260 may be configured to align the clock signals or sampling clocks to be aligned at same point on the waveform, to measure at the peak of each waveform. Without the signal aligner, if the measurement is off by 90 degrees, without alignment, the sampler may sample zero and 5 V.

The signal aligner 260 may comprise hardware, firmware and/or software components. The signal aligner 260 may comprise an alignment circuit. In an example embodiment, the plurality of samplers comprises a first sampler 230 configured to receive a first RF signal 1 and a second sampler 232 configured to receive a second RF signal N. In such an example embodiment, the signal aligner 260 may comprise an alignment circuit controlled by a data analysis metric generated by the data analyzer and configured to enable phase alignment of received clock signals to align sampling of the first and second RF signals.

In another example embodiment, the plurality of samplers comprise a first sampler 230 configured to receive a first RF signal 1 and a second sampler 232 configured to receive a second RF signal N. The signal aligner 260 may comprise an alignment circuit controlled by a data analysis metric generated by the data analyzer and configured to enable amplitude alignment, or gain alignment, of first and second received clock signals to align sampling of the first and second RF signals.

In a further example embodiment, the plurality of samplers comprise a first sampler 230 configured to receive an input RF signal with respect to a device-under-observation and a second sampler 232 configured to receive a corresponding output RF signal. The signal aligner 260 may comprise an alignment circuit controlled by a data analysis metric generated by the data analyzer and configured to enable phase alignment or amplitude alignment of first and second received clock signals to align sampling of the input RF signal and the corresponding output RF signal.

In an example embodiment, the signal aligner 260 may be provided as part of a feedback loop provided to align the signals, which may be dynamically adjusted. For example, if the temperature moves, the gain may move. The signal aligner 260 may comprise hardware, software and/or firmware configured to obtain and observe the statistical data, for example from the data analyzer 250, and observe that the collected samples comprise a lot of sampling of zero volts at the input, indicating that it is not properly aligned. The signal aligner 260 may be configured to move the sampling point based on the detected samples having a particular characteristic, such as being at zero volts. There are a number of different ways to align those signals, and the signal aligner 260 may employ one or more of those alignment approaches.

In an example embodiment as shown in FIG. 2, the signal analyzer 260 further comprises a plurality of delay elements. Each of the plurality of delay elements is configured to apply a delay to a respective one of the plurality of received clock signals 220 and to provide a delayed clock signal to one of the plurality of samplers. For example, first delay element 270 is configured to apply a first delay to the clock signal 220 to provide a first delayed clock signal 280 to a first sampler 230. Similarly, second delay element 272 is configured to apply a second delay to the clock signal 220 to provide a second delayed clock signal 282 to a second sampler 232. The delays for the plurality of delay elements, which in FIG. 2 are delay elements 270 and 272, are configured for aligning the plurality of clock signals to align sampling of the plurality of RF signals, e.g. RF signal 1 and RF signal N, at the same relative waveform position on each of the RF signal waveforms, by each of the samplers.

The delay elements may be employed to perform relative measurement. For example, to measure the gain and phase differences between RF signal 1 and RF signal N, it is necessary to align the clocks so that they sample at the same point on the RF signal waveform. The delay blocks align sampling to the same points on the RF signal, for example ensuring that both samples are at the peak, or at least that the samples are taken for different RF signal inputs at the same point on the signal. If the signals were not aligned and the delays not provided, the sensor circuit would obtain invalid relative measurements over and over. As an example, with a clock rate of 1.1 GHz and carrier frequency is 27 GHz, and the sampling clock is moving relative to the signal. The sensor circuit may slide across the carrier wave period. Relative signals are occurring at the same point in the period, based on use of the delays. The delay blocks ensure that the two samplers are sampling at the same relative point in the signal period for the two signals being sampled.

The plurality of samplers 230 . . . 232 may be configured to receive a plurality of radio frequency signals, for example RF signal 1 through to RF signal N, as shown in FIG. 2, and to receive the respective delayed clock signals 280 . . . 282 generated by the clock source 210 via the signal aligner 260, as described above. The plurality of samplers 230 . . . 232 may be configured to produce, based on the respective delayed clock signals, a plurality of low-frequency samples 240 . . . 242. For example, first sampler 230 may be configured to produce a first sample 240 based on the received RF signal 1 and the clock rate of the first delayed clock signal 280. Second sampler 232 may be configured to produce a second sample 242 based on the received RF signal N and the clock rate of the second delayed clock signal 282.

The plurality of samplers 230 . . . 232 may be configured to produce the low-frequency samples at a sub-Nyquist sampling rate. Sampling at a low-frequency such as a sub-Nyquist sampling rate contributes to embodiments of the present disclosure providing power savings and advantages compared to known approaches that are power hungry when sampling at a higher frequency, such as at or above the Nyquist rate. The plurality of samplers 230 . . . 232 may be configured to produce the low-frequency-samples at a sampling rate that is asynchronous to the RF signal, or that is synchronous to the RF signal.

One or more of the plurality of samplers 130 . . . 132 may comprise a 1-bit sampler or a multi-bit sampler, and may comprise a low-power sample-and-hold sampler.

A data analyzer 250 may be configured to process low-resolution representations of the plurality of low-frequency samples 240 . . . 242 collected or accumulated over a plurality of sampling instances and to generate a data analysis metric 252 associated with the plurality of RF signals. In an example embodiment, the data analyzer 250 is configured to process medium-resolution representations of the plurality of low-frequency samples. In an example embodiment, the data analyzer 250 is configured to produce or generate low-resolution or medium-resolution representations of the plurality of low-frequency samples. In an example embodiment, the data analyzer 250 is configured to generate a plurality of data analysis metrics 252 associated with the plurality of RF signals.

In an example embodiment, the data analyzer 250 is configured to provide the generated data analysis metric 252 as information input to a controller (not shown in FIG. 1) to optimize performance of a device-under-observation producing the RF waveform. In such an implementation, the controller may control parameters associated with the device-under-observation. In an example embodiment, the data analyzer 250 is configured to perform data correlation to determine amplitude and phase relationships. In an example embodiment, the generated data analysis metric 252 comprises: relative gain; relative phase; relative distortion; voltage standing wave ratio (VSWR); voltage distribution; current distribution; or reliability protection, or any other parameters or characteristics that may be relevant.

The data analyzer 250 may receive a samples which it may process in 1-bit or multi-bit format. Each sampler may be a low power sampler running at a low clock rate. The data analyzer 250 may collect information about various RF signals, build up statistics about what was observed, use the built up statistics to generate certain metrics, or to generate properties for certain metrics.

Figure 3:
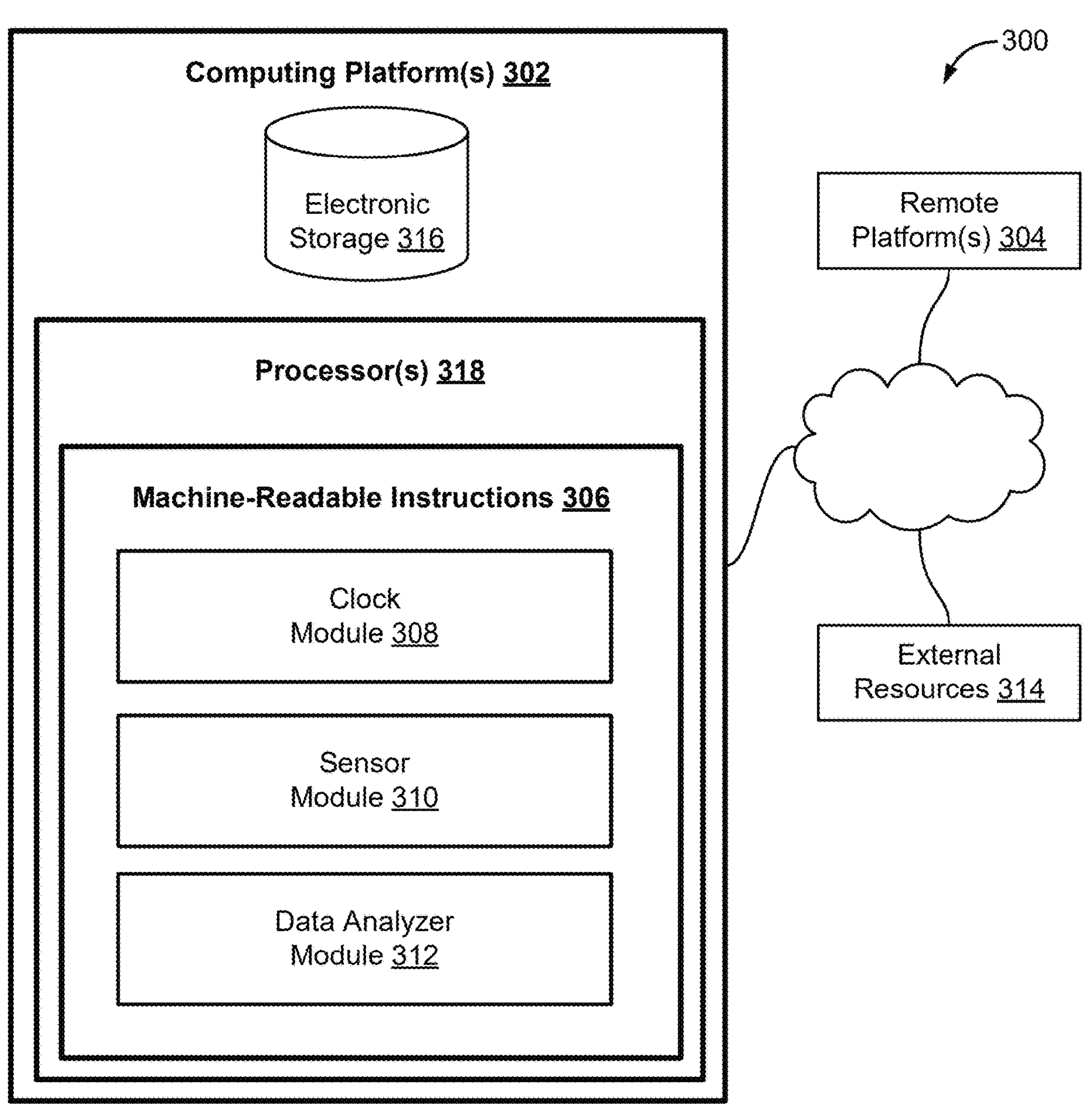
FIG. 3 is a functional block diagram illustrating an apparatus, in accordance with one or more embodiments, such as a sampler or a sensor circuit.

FIG. 3 is a functional block diagram illustrating an apparatus 300, in accordance with one or more embodiments, such as a sampler or a sensor circuit. The embodiments of FIG. 1 and FIG. 2 illustrate a sensor circuit in specific implementations, which may be implemented in a product and at one location, for example with all of the elements being on-chip. The embodiment of FIG. 3 illustrates that some functionality may be distributed, or provided as modules.

In some embodiments, system 300 may include one or more computing platforms 302. Computing platform(s) 302 may be configured to communicate with one or more remote platforms 304 according to a client/server architecture, a peer-to-peer architecture, and/or other architectures. Remote platform(s) 304 may be configured to communicate with other remote platforms via computing platform(s) 302 and/or according to a client/server architecture, a peer-to-peer architecture, and/or other architectures. Users may access system 300 via remote platform(s) 304.

Computing platform(s) 302 may be configured by machine-readable instructions 306. Machine-readable instructions 306 may include one or more instruction modules. The instruction modules may include computer program modules. The instruction modules may include one or more of clock module 308, sensor module 310, data analyzer module 312, and/or other instruction modules.

Clock module 308 may be configured to generate a clock signal. Clock module 308 may be configured to generate a plurality of clock signals.

Sensor module 310 may be configured to receive a plurality of RF signals. Sensor module 310 may be configured to produce, based on the clock signal and on the plurality of RF signals, a plurality of low-frequency-samples.

Data analyzer module 312 may be configured to process low-resolution representations of the plurality of low-frequency-samples over a plurality of sampling instances. Data analyzer module 312 may be configured to generate a data analysis metric, or a plurality of data analysis metrics, associated with the plurality of RF signals.

In one or more embodiments, one or more of the features and characteristics described above in relation to the clock source 110 of FIG. 1 or the clock source 210 of FIG. 2 may also be applied to the clock module 308. In one or more embodiments, one or more of the features and characteristics described above in relation to the samplers 130 . . . 132 of FIG. 1 or the samplers 230 . . . 232 of FIG. 2 may also be applied to the sensor module 310. In one or more embodiments, one or more of the features and characteristics described above in relation to the data analyzer 150 of FIG. 1 or the data analyzer 250 of FIG. 2 may also be applied to the data analyzer module 312.

In some embodiments, computing platform(s) 302, remote platform(s) 304, and/or external resources 314 may be operatively linked via one or more electronic communication links. For example, such electronic communication links may be established, at least in part, via a network such as the Internet and/or other networks. It will be appreciated that this is not intended to be limiting, and that the scope of this disclosure includes implementations in which computing platform(s) 302, remote platform(s) 304, and/or external resources 314 may be operatively linked via some other communication media.

A given remote platform 304 may include one or more processors configured to execute computer program modules. The computer program modules may be configured to enable an expert or user associated with the given remote platform 304 to interface with system 300 and/or external resources 314, and/or provide other functionality attributed herein to remote platform(s) 304. By way of non-limiting example, a given remote platform 304 and/or a given computing platform 402 may include one or more of a server, a desktop computer, a laptop computer, a handheld computer, a tablet computing platform, a NetBook, a Smartphone, a gaming console, and/or other computing platforms.

External resources 314 may include sources of information outside of system 300, external entities participating with system 300, and/or other resources. In some embodiments, some or all of the functionality attributed herein to external resources 314 may be provided by resources included in system 300.

Computing platform(s) 302 may include electronic storage 316, one or more processors 318, and/or other components. Computing platform(s) 302 may include communication lines, or ports to enable the exchange of information with a network and/or other computing platforms. Illustration of computing platform(s) 302 in FIG. 3 is not intended to be limiting. Computing platform(s) 302 may include a plurality of hardware, software, and/or firmware components operating together to provide the functionality attributed herein to computing platform(s) 302. For example, computing platform(s) 302 may be implemented by a cloud of computing platforms operating together as computing platform(s) 302.

Electronic storage 316 may comprise non-transitory storage media that electronically stores information. The electronic storage media of electronic storage 316 may include one or both of system storage that is provided integrally (i.e., substantially non-removable) with computing platform(s) 302 and/or removable storage that is removably connectable to computing platform(s) 302 via, for example, a port (e.g., a USB port, a firewire port, etc.) or a drive (e.g., a disk drive, etc.). Electronic storage 316 may include one or more of optically readable storage media (e.g., optical disks, etc.), magnetically readable storage media (e.g., magnetic tape, magnetic hard drive, floppy drive, etc.), electrical charge-based storage media (e.g., EEPROM, RAM, etc.), solid-state storage media (e.g., flash drive, etc.), and/or other electronically readable storage media. Electronic storage 316 may include one or more virtual storage resources (e.g., cloud storage, a virtual private network, and/or other virtual storage resources). Electronic storage 316 may store software algorithms, information determined by processor(s) 318, information received from computing platform(s) 302, information received from remote platform(s) 404, and/or other information that enables computing platform(s) 302 to function as described herein.

Processor(s) 318 may be configured to provide information processing capabilities in computing platform(s) 302. As such, processor(s) 318 may include one or more of a digital processor, an analog processor, a digital circuit designed to process information, an analog circuit designed to process information, a state machine, and/or other mechanisms for electronically processing information. Although processor(s) 318 is shown in FIG. 3 as a single entity, this is for illustrative purposes only. In some embodiments, processor(s) 318 may include a plurality of processing units. These processing units may be physically located within the same device, or processor(s) 318 may represent processing functionality of a plurality of devices operating in coordination. Processor(s) 318 may be configured to execute modules 308, 310, and/or 312, and/or other modules. Processor(s) 318 may be configured to execute modules 308, 310, and/or 312, and/or other modules by software; hardware; firmware; some combination of software, hardware, and/or firmware; and/or other mechanisms for configuring processing capabilities on processor(s) 318. As used herein, the term "module" may refer to any component or set of components that perform the functionality attributed to the module. This may include one or more physical processors during execution of processor readable instructions, the processor readable instructions, circuitry, hardware, storage media, or any other components.

It should be appreciated that although modules 308, 310, and/or 312 are illustrated in FIG. 3 as being implemented within a single processing unit, in embodiments in which processor(s) 318 includes multiple processing units, one or more of modules 308, 310, and/or 312 may be implemented remotely from the other modules. The description of the functionality provided by the different modules 308, 310, and/or 312 described below is for illustrative purposes, and is not intended to be limiting, as any of modules 308, 310, and/or 312 may provide more or less functionality than is described. For example, one or more of modules 308, 310, and/or 312 may be eliminated, and some or all of its functionality may be provided by other ones of modules 308, 310, and/or 312. As another example, processor(s) 318 may be configured to execute one or more additional modules that may perform some or all of the functionality attributed below to one of modules 308, 310 and/or 312.

Figure 4:
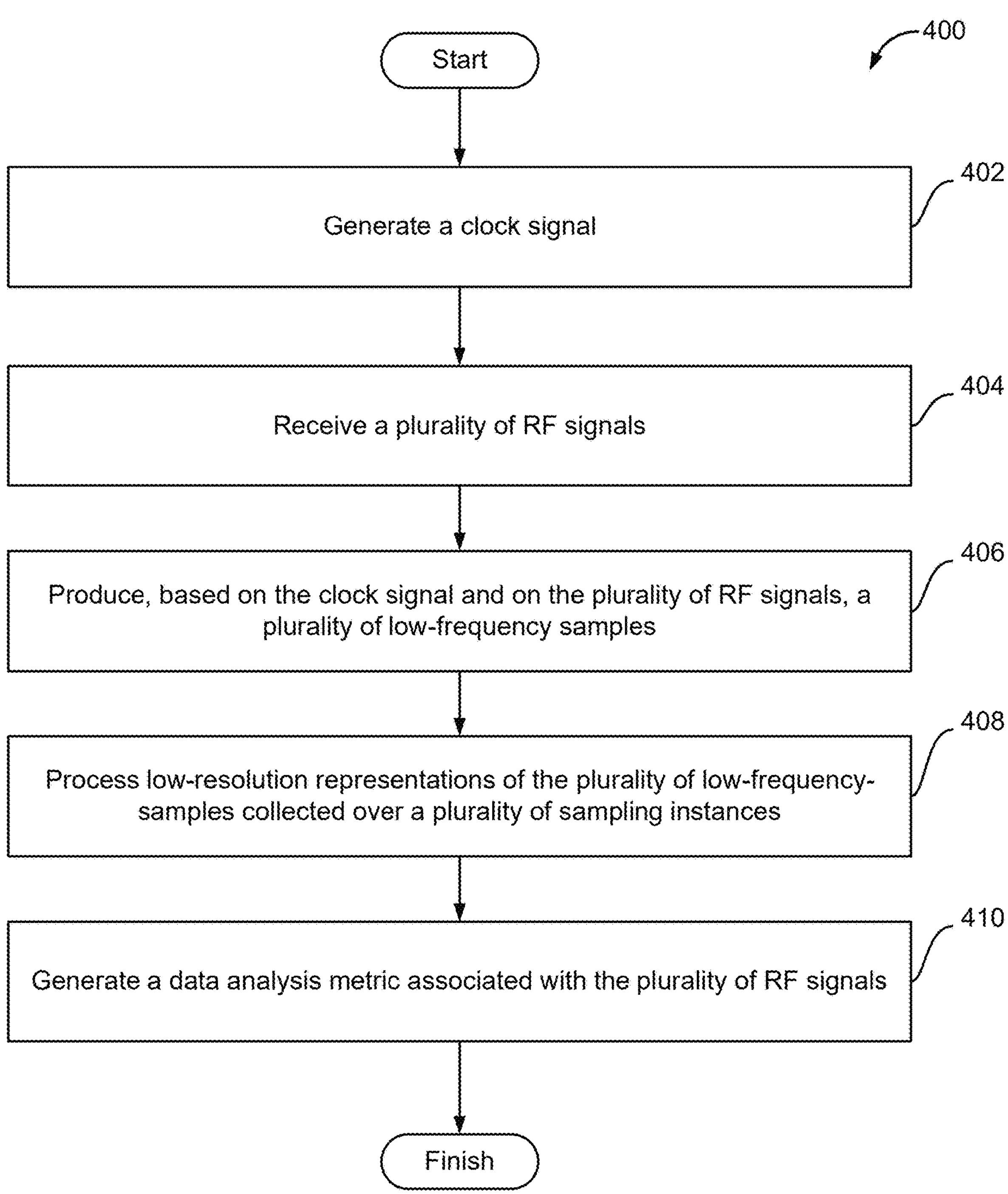
FIG. 4 illustrates a method for processing an RF signal, in accordance with one or more embodiments.

FIG. 4 illustrates a method 400 for processing an RF signal, in accordance with one or more embodiments. The operations of method 400 presented below are intended to be illustrative. In some embodiments, method 400 may be accomplished with one or more additional operations not described, and/or without one or more of the operations discussed. Additionally, the order in which the operations of method 400 are illustrated in FIG. 4 and described below is not intended to be limiting.

In some embodiments, method 400 may be implemented in one or more processing devices (e.g., a digital processor, an analog processor, a digital circuit designed to process information, an analog circuit designed to process information, a state machine, and/or other mechanisms for electronically processing information). The one or more processing devices may include one or more devices executing some or all of the operations of method 400 in response to instructions stored electronically on an electronic storage medium. The one or more processing devices may include one or more devices configured through hardware, firmware, and/or software to be specifically designed for execution of one or more of the operations of method 400.

An operation 402 may include generating a clock signal. In an embodiment, operation 402 may include generating a plurality of clock signals. Operation 402 may be performed by a clock source, such as clock source 110 in FIG. 1 or clock source 210 in FIG. 2, or by one or more hardware processors configured by machine-readable instructions including a module that is the same as or similar to clock module 308 in FIG. 3, in accordance with one or more embodiments. Operation 402 may comprise applying a delay to the clock signal(s) and providing a plurality of delayed clock signals to a plurality of samplers. For example, operation 402 may comprise applying a first delay to the clock signal to provide a first delayed clock signal to a first sampler, and applying a second delay to the clock signal to provide a second delayed clock signal to a second sampler.

An operation 404 may include receiving a plurality of RF signals. The plurality of RF signals may include RF signal 1 . . . . RF signal N. Operation 404 may be performed by one or more samplers, such as samplers 130 . . . 132 of FIG. 1 or samplers 230 . . . 232 of FIG. 2, or by one or more hardware processors configured by machine-readable instructions including a module that is the same as or similar to sensor module 308 in FIG. 3, in accordance with one or more embodiments. The plurality of RF signals may first be received by one or more signal conditioners, such as signal conditioners 290 . . . 292 of FIG. 2. One or more of the signal conditioners may comprise an attenuator. One or more of the signal conditioners may comprise a filter, such as a harmonic filter. For example, when the sensor circuit is used to sense an output of a PA, the PA output may have distortion like a harmonic. In that case, the signal conditioner may comprise a filter that removes the harmonic.

An operation 406 may include producing, based on the clock signal and on the plurality of RF signals, a plurality of low-frequency-samples. Operation 406 may be performed by one or more samplers, such as samplers 130 . . . 132 of FIG. 1 or samplers 230 . . . 232 of FIG. 2, or by one or more hardware processors configured by machine-readable instructions including a module that is the same as or similar to sensor module 308 in FIG. 3, in accordance with one or more embodiments.

An operation 408 may include processing low-resolution representations of the plurality of low-frequency-samples collected over a plurality of sampling instances. Operation 408 may include processing medium-resolution representations of the plurality of low-frequency-samples collected over a plurality of sampling instances. Operation 508 may be performed by the data analyzer 150 of FIG. 1 or the data analyzer 250 of FIG. 2. Operation 408 may be performed by one or more hardware processors configured by machine-readable instructions including a module that is the same as or similar to data analyzer module 312 in FIG. 3, in accordance with one or more embodiments.

An operation 410 may include generating a data analysis metric associated with the plurality of RF signals. Operation 410 may include generating a plurality of data analysis metrics associated with the plurality of RF signals. Operation 410 may comprise providing the generated data analysis metric as information input to a controller to optimize performance of a device-under-observation producing the RF waveform. Operation 410 may comprise performing data correlation to determine amplitude and phase relationships. The generated data analysis metric may comprise: relative gain; relative phase; relative distortion; voltage standing wave ratio; voltage distribution; current distribution; or reliability protection, or any other parameters or characteristics that may be relevant.

Operation 410 may be performed by the data analyzer 150 of FIG. 1 or the data analyzer 250 of FIG. 2. Operation 410 may be performed by one or more hardware processors configured by machine-readable instructions including a module that is the same as or similar to data analyzer module 312 in FIG. 3, in accordance with one or more embodiments.

In an embodiment, the present disclosure provides a processor-implemented method for processing radio frequency signals, the method comprising: generating a clock signal; receiving a plurality of RF signals; producing, based on the clock signal and on the plurality of RF signals, a plurality of low-frequency samples; processing low-resolution representations of the plurality of low-frequency-samples collected over a plurality of sampling instances; and generating a data analysis metric associated with the plurality of RF signals.

In a further embodiment, the present disclosure provides an apparatus comprising: a non-transient computer-readable storage medium having executable instructions embodied thereon; and one or more hardware processors configured to execute the instructions to: generate a clock signal; receive a plurality of RF signals; produce, based on the clock signal and on the plurality of RF signals, a plurality of low-frequency-samples; process low-resolution representations of the plurality of low-frequency samples collected over a plurality of sampling instances; and generate a data analysis metric associated with the plurality of RF signals.

Embodiments of the present disclosure provides a system comprising low rate, low resolution sampling of an RF circuit, such as a power amplifier. Embodiments of the present disclosure may be used in applications such as RF & mmWave communications and sensing. Embodiments of the present disclosure provide low-power samplers, which may be sample-and-hold samplers, to measure a plethora of RF signals.

A clock source may be provided to drive samplers. The sampling rate may be sub-Nyquist, and may be synchronous or asynchronous to an input RF signal. Precise, adjustable delays may be provided on clocks to various samplers. A signal conditioning circuit, e.g. a filter such as a harmonic filter, may be provided ahead of the samplers.

At a data analyzer, a statistical ensemble of one-bit and/or multi-bit samples and sample correlations may be collected, processed, and used to measure and/or analyze key metrics. For example, the data analyzer may process or generate low-resolution or medium-resolution representations of a plurality of low-frequency samples collected or accumulated over a plurality of sampling instances. Example metrics include: relative gain and phase, relative distortion, VSWR, voltage and current distributions, reliability protection, etc.

Embodiments of the present disclosure also enable phase and gain alignment of relative signals (e.g. Vi and Vo). Such an embodiment requires very good sampling clock stability and adjustability between the two samplers.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a compact disk read only memory (CD-ROM), digital versatile disk (DVD), Blu-ray Disc Read Only Memory (BD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

Embodiments of the disclosure can be described with reference to the following clauses, with specific features laid out in the dependent clauses.

In an aspect, the present disclosure provides a sensor circuit comprising: a clock source configured to generate a clock signal; a plurality of samplers configured to receive a plurality of radio frequency signals and to produce, based on the clock signal, a plurality of low-frequency samples; and a data analyzer configured to process low-resolution representations of the plurality of low-frequency samples collected over a plurality of sampling instances and to generate a data analysis metric associated with the plurality of RF signals.

In an example embodiment, the circuit further comprises: a signal aligner configured to align a plurality of received clock signals for sampling, at each of the plurality of samplers, at the same relative waveform position on each of the plurality of RF signals.

In an example embodiment, the signal aligner further comprises: a plurality of delay elements each configured to apply a delay to one of the plurality of received clock signals and to provide a delayed clock signal to one of the plurality of samplers, the delays for the plurality of delay elements being configured for aligning the plurality of clock signals for sampling the plurality of RF signals at the same relative waveform position.

In an example embodiment, the plurality of samplers comprises a first sampler configured to receive a first RF signal and a second sampler configured to receive a second RF signal, and the signal aligner comprises: an alignment circuit controlled by the data analysis metric generated by the data analyzer and configured to enable phase alignment of first and second received clock signals to align sampling of the first and second RF signals.

In an example embodiment, the plurality of samplers comprises a first sampler configured to receive a first RF signal and a second sampler configured to receive a second RF signal, and the signal aligner comprises: an alignment circuit controlled by the data analysis metric generated by the data analyzer and configured to enable amplitude alignment of first and second received clock signals to align sampling of the first and second RF signals.

In an example embodiment, the plurality of samplers comprises a first sampler configured to receive an input RF signal with respect to a device-under-observation and a second sampler configured to receive a corresponding output RF signal, and the signal aligner comprises: an alignment circuit controlled by a metric generated by the data analyzer and configured to enable phase alignment or amplitude alignment of first and second received clock signals to align sampling of the input RF signal and the corresponding output RF signal.

In an example embodiment, the plurality of samplers are configured to produce the low-frequency samples at a sub-Nyquist sampling rate.

In an example embodiment, the plurality of samplers are configured to produce the low-frequency samples at a sampling rate that is asynchronous to the RF signal.

In an example embodiment, one or more of the plurality of samplers comprises a low-power sample-and-hold sampler.

In an example embodiment, the circuit further comprises: a signal conditioner configured to condition one or more of the plurality of RF signals prior to being provided to the samplers.

In an example embodiment, the data analyzer is configured to provide the generated data analysis metric as information input to a controller to optimize performance of a device-under-observation producing the RF waveform.

In an example embodiment, the data analyzer is configured to perform data correlation to determine amplitude and phase relationships.

In an example embodiment, the data analyzer is configured to generate the data analysis metric based on a low-resolution representation of a comparison of the plurality of low-frequency samples.

In an example embodiment, the data analyzer is configured to process medium-resolution representations of the plurality of low-frequency samples collected over the plurality of sampling instances.

In an example embodiment, the generated data analysis metric comprises: relative gain; relative phase; relative distortion; voltage standing wave ratio (VSWR); voltage distribution; current distribution; or reliability protection.

In another aspect, the present disclosure provides a sensor system comprising: the sensor circuit as both generally and specifically described and illustrated herein; and an RF circuit configured to produce one or more of the plurality of RF signals.

In a further aspect, the present disclosure provides a processor-implemented method for processing radio frequency signals, the method comprising: generating a clock signal; receiving a plurality of RF signals; producing, based on the clock signal and on the plurality of RF signals, a plurality of low-frequency samples; processing low-resolution representations of the plurality of low-frequency-samples collected over a plurality of sampling instances; and generating a data analysis metric associated with the plurality of RF signals.

In a yet further aspect, the present disclosure provides an apparatus comprising: a non-transient computer-readable storage medium having executable instructions embodied thereon; and one or more hardware processors configured to execute the instructions to: generate a clock signal; receive a plurality of RF signals; produce, based on the clock signal and on the plurality of RF signals, a plurality of low-frequency samples; processing low-resolution representations of the plurality of low-frequency samples collected over a plurality of sampling instances; and generate a data analysis metric associated with the plurality of RF signals.

In a still further aspect, the present disclosure provides a sensor circuit, comprising: a clock source configured to generate a clock signal; a sampler configured to receive a radio frequency signal and to produce, based on the clock signal, a low-frequency sample; and a data analyzer configured to process low-resolution representations of the low-frequency samples collected over a plurality of sampling instances and to generate a data analysis metric associated with the RF signal.

The invention claimed is:

1. A method for processing radio frequency (RF) signals, the method comprising:

generating a clock signal;

receiving a plurality of RF signals;

producing, based on the clock signal and on the plurality of RF signals, a plurality of low-frequency samples;

processing low-resolution representations of the plurality of low-frequency-samples collected over a plurality of sampling instances;

receiving a plurality of the generated clock signals as a plurality of received clock signals;

aligning the plurality of received clock signals for sampling at the same relative waveform position on each of the plurality of RF signals; and generating a data analysis metric associated with the plurality of RF signals.

2. The method of claim 1 further comprising:

applying a respective delay to each of the plurality of received clock signals, the respective delay being configured for aligning each of the plurality of received clock signals for sampling the plurality of RF signals at the same relative waveform position; and providing a plurality of delayed clock signals based on applying the respective delay to each of the plurality of received clock signals.

3. The method of claim 1, wherein the plurality of RF signals comprises first and second RF signals, the method further comprising:

performing phase alignment of first and second received clock signals to align sampling of the first and second RF signals.

4. The method of claim 1, wherein the plurality of RF signals comprises first and second RF signals, the method further comprising:

performing amplitude alignment of first and second received clock signals to align sampling of the first and second RF signals.

5. The method of claim 1, wherein the plurality of RF signals comprises first and second RF signals, the method further comprising:

performing phase alignment or amplitude alignment of first and second received clock signals to align sampling of the input RF signal and the corresponding output RF signal.

6. The method of claim 1, further comprising producing the low-frequency samples at a sub-Nyquist sampling rate.

7. The method of claim 1, wherein the clock signal has a clock rate that is asynchronous to the RF signal.

8. The method of claim 1, further comprising producing the low-frequency samples at a sampling rate that is asynchronous to the RF signal.

9. The method of claim 1, wherein providing the plurality of low-frequency samples is performed using low-power sample-and-hold sampling.

10. The method of claim 1, further comprising:

conditioning one or more of the plurality of RF signals prior to producing the plurality of low-frequency samples.

11. The method of claim 1, further comprising:

providing the generated data analysis metric to optimize performance of a device-under-observation producing the RF waveform.

12. The method of claim 1, further comprising performing data correlation to determine amplitude and phase relationships.

13. The method of claim 1, further comprising generating the data analysis metric based on a low-resolution representation of a comparison of the plurality of low-frequency samples.

14. The method of claim 1, further comprising processing medium-resolution representations of the plurality of low-frequency samples collected over the plurality of sampling instances.

15. The method of claim 1, wherein generating the data analysis metric comprises generating: relative gain; relative phase; relative distortion; voltage standing wave ratio (VSWR); voltage distribution; current distribution; or reliability protection.

16. An apparatus comprising:

a non-transient computer-readable storage medium having executable instructions embodied thereon; and one or more hardware processors configured to execute the instructions to:

generate a clock signal;

receive a plurality of RF signals;

produce, based on the clock signal and on the plurality of RF signals, a plurality of low-frequency samples;

process low-resolution representations of the plurality of low-frequency samples collected over a plurality of sampling instances;

receive a plurality of the generated clock signals as a plurality of received clock signals;

align the plurality of received clock signals for sampling at the same relative waveform position on each of the plurality of RF signals; and generate a data analysis metric associated with the plurality of RF signals.

17. The apparatus of claim 16, wherein the one or more hardware processors are further configured to execute the instructions to:

apply a respective delay to each of the plurality of received clock signals, the respective delay being configured for aligning each of the plurality of received clock signals for sampling the plurality of RF signals at the same relative waveform position; and provide a plurality of delayed clock signals based on applying the respective delay to each of the plurality of received clock signals.

18. The apparatus of claim 16, wherein the plurality of RF signals comprises first and second RF signals, and wherein the one or more hardware processors are further configured to execute the instructions to:

perform phase alignment of first and second received clock signals to align sampling of the first and second RF signals.

19. The apparatus of claim 16, wherein the plurality of RF signals comprises first and second RF signals, and wherein the one or more hardware processors are further configured to execute the instructions to:

perform amplitude alignment of first and second received clock signals to align sampling of the first and second RF signals.

20. The apparatus of claim 16, wherein the plurality of RF signals comprises first and second RF signals, and wherein the one or more hardware processors are further configured to execute the instructions to:

perform phase alignment or amplitude alignment of first and second received clock signals to align sampling of the input RF signal and the corresponding output RF signal.

21. The apparatus of claim 16, wherein the one or more hardware processors are further configured to execute the instructions to:

produce the low-frequency samples at a sub-Nyquist sampling rate.

22. The apparatus of claim 16, wherein the clock signal has a clock rate that is asynchronous to the RF signal.

23. The apparatus of claim 16, wherein the one or more hardware processors are further configured to execute the instructions to:

produce the low-frequency samples at a sampling rate that is asynchronous to the RF signal.

24. The apparatus of claim 16, wherein the one or more hardware processors are further configured to execute the instructions to provide the plurality of low-frequency samples using low-power sample-and-hold sampling.

25. The apparatus of claim 16, wherein the one or more hardware processors are further configured to execute the instructions to:

condition one or more of the plurality of RF signals prior to producing the plurality of low-frequency samples.

26. The apparatus of claim 16, wherein the one or more hardware processors are further configured to execute the instructions to:

provide the generated data analysis metric to optimize performance of a device-under-observation producing the RF waveform.

27. The apparatus of claim 16, wherein the one or more hardware processors are further configured to execute the instructions to:

perform data correlation to determine amplitude and phase relationships.

28. The apparatus of claim 16, wherein the one or more hardware processors are further configured to execute the instructions to:

generate the data analysis metric based on a low-resolution representation of a comparison of the plurality of low-frequency samples.

29. The apparatus of claim 16, wherein the one or more hardware processors are further configured to execute the instructions to:

process medium-resolution representations of the plurality of low-frequency samples collected over the plurality of sampling instances.

30. The apparatus of claim 16, wherein the one or more hardware processors are further configured to execute the instructions to generate the data analysis metric by generating: relative gain; relative phase; relative distortion; voltage standing wave ratio (VSWR); voltage distribution; current distribution; or reliability protection.

* * * * *